United States Patent [19]

Bordui et al.

[11] Patent Number: 4,761,202

[45] Date of Patent: Aug. 2, 1988

[54] PROCESS FOR CRYSTAL GROWTH OF KTIOPO4 FROM SOLUTION

[75] Inventors: Peter F. Bordui, Menlo Park, Calif.; Gabriel M. Loiacono, Franklin Lakes, N.J.

[73] Assignee: U.S. Philips Corporation, New York, N.Y.

[21] Appl. No.: 24,239

[22] Filed: Mar. 10, 1987

Related U.S. Application Data

[63] Continuation-in-part of Ser. No. 869,170, May 30, 1986, abandoned.

[51] Int. Cl.$^4$ .................. C30B 9/04; C30B 15/00
[52] U.S. Cl. ..................... 156/621; 156/622; 156/624; 156/DIG. 70; 156/DIG. 79; 156/DIG. 75; 156/DIG. 81
[58] Field of Search .................. 156/621, 622, 623 R, 156/624, DIG. 70, DIG. 71, DIG. 75, DIG. 81

[56] References Cited

U.S. PATENT DOCUMENTS

| | | | |
|---|---|---|---|
| 3,949,323 | 4/1976 | Bierlein et al. | 156/DIG. 71 |
| 4,094,731 | 6/1978 | Keyser et al. | 156/622 |
| 4,231,838 | 11/1980 | Gier | 156/DIG. 75 |
| 4,305,778 | 12/1981 | Gier | 156/623 R |

OTHER PUBLICATIONS

Mullin, Crystallisation, CRC Press, Cleveland, Ohio, 1972, pp. 261 to 263.
Jacco et al., Flux Growth and Properties of KTiOPO4, Journal of Crystal Growth, vol. 70 (1984), pp. 484–488.

Primary Examiner—John Doll
Assistant Examiner—Robert M. Kunemund
Attorney, Agent, or Firm—Norman N. Spain

[57] ABSTRACT

Large flow-free crystals of KiTiOPO4 and the Rb, Tl, and As analogs are produced by preparing a melt of KtiOPO4 or its analog in a flux in which the ratio by weight of KTiOPO4 to the flux at the seeding temperature is equal to the saturation value of the KTiOPO4 in the flux, suspending a crytal of KTiOPO4 in the melt and then slowly decreasing the temperature of the melt while essentially spatially isothermal conditions are provided throughout the melt.

25 Claims, 1 Drawing Sheet

PROCESS FOR CRYSTAL GROWTH OF KTIOPO$_4$ FROM SOLUTION

RELATED APPLICATION

This application is a continuation-in-part of application Ser. No. 869,170, filed May 30, 1986, now abandoned.

BACKGROUND OF THE INVENTION

This invention relates to a method for the production of large substantially flaw-free single crystals of KTiOPO$_4$ and the Rb, Tl and As analogues thereof.

U.S. Pat. No. 3,949,323 teaches the use of flaw-free optically useful crystals of KTiOPO$_4$ (KTP) and their analogues in nonlinear optical devices. This patent and European Patent Specification No. 0022193 disclose the preparation of such crystals by hydrothermal processes. Additionally F. C. Zumsteg et al, J. Appl. Phys. 47, 4980 (1986), R. A. Laudise et al, J. Crystal Growth 74, 275–280 (1986) and R. F. Belt et al, Laser Focus Electro-Optics, 110–124 (October 1983) indicate that hydrothermal processes are the preferred methods of growing KTiOPO$_4$ crystals. The Belt et al article at page 112 and 124 specifically advises against the use of methods other than hydrothermal processes including ordinary flux growth methods.

Due to the requirements for the use of high pressures (on the order of hundreds of atmospheres) and high temperatures in these hydrothermal processes, the equipment required is very costly and may be difficult to manufacture. Further, these hydrothermal processes have the additional disadvantage of providing an undesirably slow rate of crystal growth. Additionally, while crystals of certain desired orientation as large as three or four millimeters have been cut from crystals grown by the use of these processes, it is desirable, for some optical purposes, that oriented crystals of much larger size of the order of centimeters, for example of three or four centimeters, be provided.

Another process for the manufacture of KTiOPO$_4$ and its analogues is that shown in U.S. Pat. No. 4,231,838. In the process described in this patent, crystal growth is carried out by heating a mixture of MTiOXO$_4$ and a nonaqueous flux M|X|O| (where M is K, Tl, Rb or mixtures thereof, and X is P or As) or their precursors to produce a nonaqueous melt and then causing crystal growth of MTiOXO$_4$ by use of a temperature gradient or by slow cooling of the melt at a rate of not greater than 5° C. per hour. Here too, under the conditions described, the problem exists that the crystals produced are of relatively small size, the largest, as shown in Example 5 of this patent, being 15 mm×8 mm×2 mm.

J. C. Jacco et al 2. Crystal Growth, 76 (1986) pages 484–488 shows crystal growth of KTiOPO$_4$ by use of various flux growth techniques including seeded growth by slow cooling using a rotating crucible 120 mm in diameter rotatable about its vertical axis. While crystals up to 15×15×5 mm in size were grown, these crystals were of poor quality containing a large amount of inclusions. Jacco et al show also that by crystal growth by gradient transport good quality crystals containing a minimum amount of inclusions were produced. However, crystals of only up to 5×7×12 mm in size were able to be grown by this method.

Additionally, the Jacco et al article states that when TSSG (top seeded solution growth) was employed using both gradient and "isothermal conditions" with and without rotation of the seed, multiple nucleation occurred resulting in formation of only needle prisms.

As evidenced in the prior art exemplified by pages 285 and 299 as well as the figures of Elwell et al, Crystal Growth from High-Temperature Solutions, New York, Academic Press 1975, pp. 272, 273, 283–285, 298, 299, the term "isothermal conditions" employed in the Jacco et al article meant that no attempt is made to provide a temperature gradient in the melt as is used in other growing processes. While Jacco et al might have thought that they had established an adequate degree of spatial isothermal conditions in the melt, in the context of the then-existent state of the art, the normal equipment used and processes employed inevitably created temperature gradients in the melt of the order of 20° C. per centimeter or more. Since none of the workers in the art had linked this small temperature difference to the development of spurious nucleation in the melt, it was considered to be "isothermal conditions". This meaning of the term "isothermal conditions" as used in the Jacco et al article is also evidenced by R. A. Laudise—The Growth of Single Crystals (1970), Prentice-Hall, (Englewood Cliffs N.J.), page 258. It is also noted that the TSSG growth process described by Jacco et al involved positioning of the seed at the melt surface.

SUMMARY OF THE INVENTION

A principal object of this invention is to provide an improved method for the production of substantially flaw-free single crystals of MTiOX$_4$.

An additional object of this invention is to provide a method for the production of substantially flaw-free single crystals of MTiOXO$_4$ of increased size.

Still another object of the invention is to provide an improved apparatus particularly adapted for the production of large substantially flaw-free single crystals of MTiOXo$_4$.

These and other objects of the invention will be apparent from the description that follows.

We have discovered that, contrary to what is taught in the Jacco et al article and the other KTP growth publications, it is possible to grow substantially flaw-free large single crystals of such compounds by use of flux growth techniques, provided that the growth is carried out under essentially spatially isothermal conditions, as defined below.

According to the invention, a method is provided for producing large substantially flaw-free single crystals of a composition of the formula MTiOXO$_4$ from a melt produced by heating a mixture of MTiOXO$_4$ and a flux comprising the oxides of M and X (wherein M and X have their above-designated meanings) in the ratio by weight of M to X of from 3 to 1 to 1 to 1, the ratio by weight of MTiOXO$_4$ to flux at the seeding temperature—the temperature at which a seed crystal of MiTiOXO$_4$ is suspended in the flux being substantially equal to the saturation value of the MTiOXO$_4$ in the flux, or of their precursors, by slowly cooling the melt while the melt is maintained under essentially spatially isothermal conditions to thereby cause the MTiOXO$_4$ to crystallize from the melt onto a seed crystal of MTiOXO$_4$ suspended in the melt.

For the purposes of the invention, the melt is considered to be maintained under essentially spatially isothermal conditions when the maximum difference in temperatures between any two points in the melt is not greater than about 4° C., and preferably less than 2° C. In a preferred embodiment, the defined spatially isothermal conditions at high-temperature used during the growth process, are achieved by surrounding the crucible containing the melt with an elongated heat pipe, preferably constructed of a double-walled Inconel tube filled with sodium.

GENERAL DESCRIPTION OF THE DRAWING

DETAILED DESCRIPTION OF THE INVENTION

Figures 1, 2:
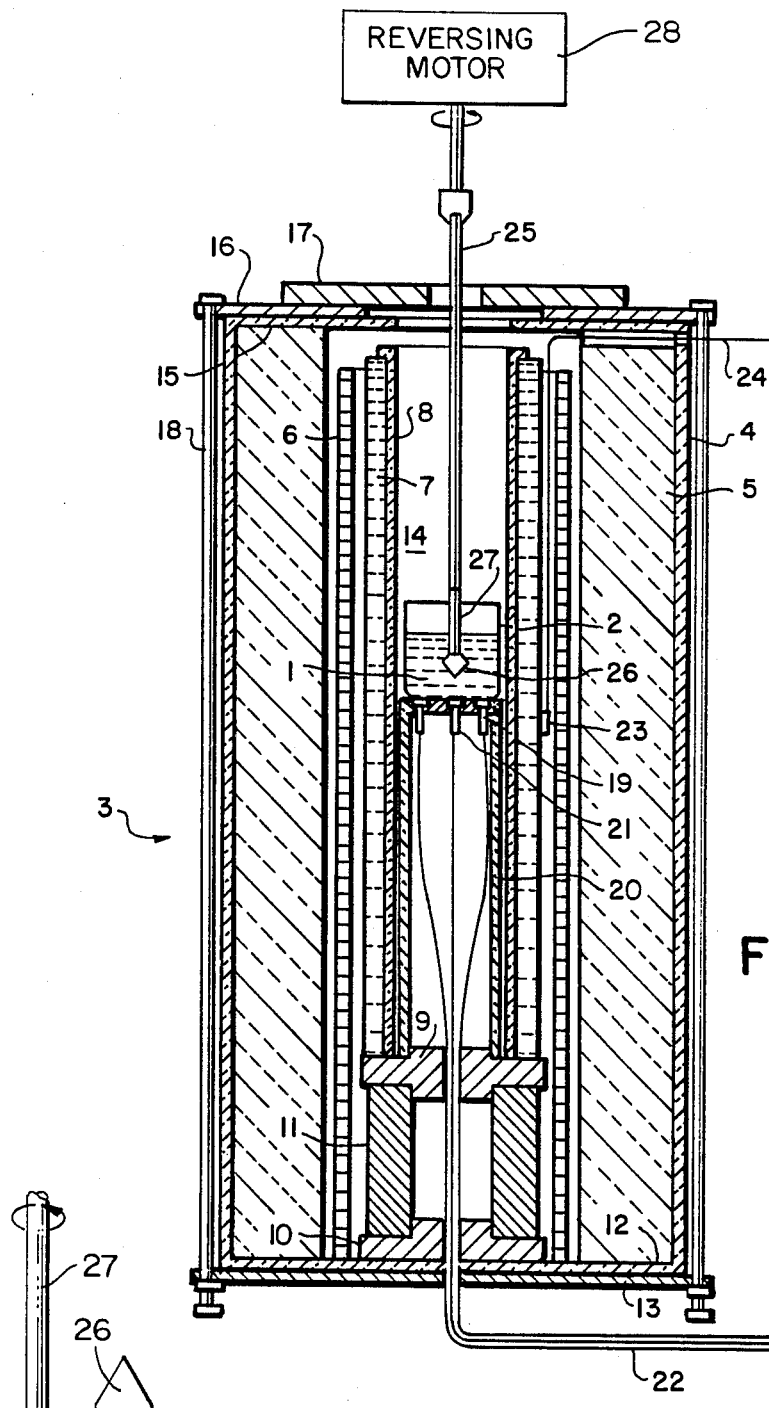
FIG. 1 is a cross-sectional view of an apparatus used to carry out the crystal-growing method of the invention.
FIG. 2 is a cross-sectional view of a seed crystal showing a preferred orientation of the seed in the melt.

While good crystals may be formed without rotation of the crystal seed, the crystal seed is preferably rotated while in the melt in order to further minimize the number and size of the flaws in the crystal. Best results are achieved when the direction of rotation is periodically reversed.

While good results may be produced by use of a flux comprising the oxides of M and X in the ratio by weight of M to X in the range of 3:1 to 1:1, best results are achieved when the ratio by weight of M to X is about 1.5:1 to 1:1.

The flux may comprise a mixture of the oxides of M and X such as $M_2O$ and $X_2O_5$ or of the precursors which form such oxides during the heating process, such as carbonates or nitrates of M or the ammonium salts of X, examples being $K_2HPO_4$, $KH_2PO_4$, $NH_4H_2PO_4$, $(NH_4)_2HPO_4$ and $(NH_4)_2HAsO_4$.

While the method of the invention may be used to grow large flaw-free crystals of any material of the type $MTiOXO_4$ it is particularly useful for crystals of $KTiOPO_4$ (KTP). Preferably the $KTiOPO_4$ crystals are prepared from a mixture of $TiO_2$, $KH_2PO_4$ and $K_2HPO_4$. If $KTiOAsO_4$ crystals are to be grown, they can be prepared from mixtures of $TiO_2$, $KH_2AsO_4$ and $KHCO_3$. In such case, arsenic volatility may require furnace modifications typical of other growth processes used for other crystals containing arsenic as is known in the art.

In producing the melt, the mixture of $MTiOXO_4$ and the flux or of their precursors is heated to a temperature of 750° C. to 1100° C. and preferably to a temperature of about 1000° C.

The growth furnace is designed to provide essentially isothermal conditions through the melt (the maximum temperature difference between any two points in the melt being about 4° C.) and preferably not greater than about 2° C. While various methods may be used to provide spatially isothermal conditions throughout the melt, preferably the crucible containing the melt is enclosed by a heat pipe the length of which is about three to eight times its internal diameter, preferably about six times. The heat pipe contains a sealed double wall filled with metallic sodium.

Before the melt-filled crucible is placed in the growth furnace the furnace is preferably preheated to the temperature of the melt in order to dissolve any crystals that may have formed in the melt during its transfer to the growth furnace. The melt-filled crucible is then placed in the growth furnace and the melt is kept at a temperature of 1000° C. to 1050° C. for about 4 hours in the growth furnace while being stirred.

The temperature of the growth furnace is then ramped to 20° C.–50° C. below the temperature of the melt over a period of about 1 to 3 hours preferably to a temperature of about 970° C.–1000° C., depending on the composition chosen, to achieve slight under-saturation as later described.

An $MTiOXO_4$ seed crystal is then suspended in the melt at the end of a rotatable shaft and held approximately in the melt center, in the growth furnace, in a stationary position for about 1 to 4 hours while the melt is maintained under essentially spatially gradient-free isothermal conditions. At this point due to the temperature employed and its composition the melt is not fully saturated (actually slightly under-saturated) thus allowing meltback of surface portions of the seed crystal into the melt thus providing clean surfaces for crystal growth on the seed crystal. The temperature of the furnace is then set to continually decrease at the rate of not greater than about 5° C. per hour, and generally at the rate of 0.1° C.–20° C. per day and preferably at the rate of 0.5° C.–10° C. per day.

The seed crystal is then rotated in the melt at a rate of 5 to 100 RPM. Preferably the direction of rotation is reversed, typically once every 5 seconds to 5 minutes with about a four second pause between reversals. After 4 to 15 days the crystal is removed from the melt but retained within the furnace.

The furnace temperature is then ramped down to a temperature of substantially below 900° C., for example to 300° C.–350° C., at the rate of 20° to 40° C. per hour to thermally stabilize the grown crystal. The crystal is then removed from the furnace.

A preferred embodiment of the invention will now be described in greater detail in the following example with reference to the figures of the drawing.

EXAMPLE

A mixture of 295 g of powdered $KH_2PO_4$, 80 g of powdered $TiO_2$, and 203 g of powdered $K_2HPO_4$ was ball-milled for 1 hour. The powdered mixture was then loaded into a 110 mm diameter by 80 mm high cylindrical platinum crucible which was placed in a muffle furnace the internal temperature of which was 1050° C. After 16 hours, the crucible was removed from the muffle furnace and the resultant liquid 1 it contained was poured into a smaller cylindrical platinum crucible 2, 80 mm in diameter by 70 mm high. This smaller crucible 2, filled with the liquid 1, was immediately introduced into a growth furnace 3 and set on a ceramic crucible base 19 in the furnace (which had been preheated to 1000° C.).

This growth furnace 3 is designed to provide essentially spatially isothermal conditions in the liquid 2 and comprises an outer wall 4 formed of silica, a layer of insulation 5 formed of $Al_2O_3$ and $SiO_2$ adjacent to a surface of the outer silica wall 4, a resistance wound heater 6 adjacent to the surface of said insulation layer 5 away from the outer silica wall 4.

A sealed, cylindrical, double-walled heat pipe 7 having an internal diameter of about 10 cm, an outer diameter of about 14 cm and a length of about 60 cm and formed of an Inconel pipe filled with sodium, to provide spatially isothermal conditions throughout the length of the crucible 2, which is located approximately at its center, and which heat pipe 7 is provided along its inner surface with a cylindrical silica heat pipe liner 8, is positioned adjacent to the resistance wound heater 6.

The heat pipe 7 and heat pipe liner 8 are supported by a first ceramic spacer 9 which in turn is supported on a second ceramic spacer 10 by a cylindrical stainless steel stand-off 11.

A silica base plate 12, supported by an aluminum support plate 13, extends along the bottom surface of the furnace.

The silica heat pipe liner 8 and the first ceramic spacer 9 define a vertical cylindrically shaped furnace cavity 14. A cover is provided for the furnace by a disc-shaped silica cover plate 15 provided with a central opening, the area of which opening corresponds approximately with the horizontal area cross-section of the furnace cavity 14. The silica cover plate 15 in turn is covered by a similar shaped aluminum cover plate 16 of a slightly larger size. A removable ceramic cover plate 17 provided with a central opening, and, extending over a portion of the furnace cavity, 14 covers a portion of the aluminum cover plate 16.

Structural stability is provided by steel tie rods 18 mechanically joining the aluminum support plate 13 and aluminum cover plate 16.

A crucible support is provided in the furnace of ceramic crucible base 19 supported on ceramic spacer 9 by a silica crucible pedestal 20.

Temperature control of contents of the crucible present on the ceramic crucible base 19 is provided by temperature reference elements 21 positioned at the upper surface of the crucible base 19 and connected to a suitable computer (not shown) by temperature reference leads 22, and by a temperature control element 23 positioned between the resistance wound heater 6 and the heat pipe 7 and connected by temperature control lead 24 to a current controlled power supply. The computer can be programmed to provide the desired temperature cycle as described herein.

A platinum stirring paddle (not shown) affixed to the end of a rotatable and translatable shaft 25 was introduced into the liquid through the opening at the top of the furnace cavity 14. This paddle was rotated in the liquid at 70 RPM for 4 hours during which period the temperature of the liquid was maintained at 1000° C. The paddle was removed from the liquid and the furnace temperature was then ramped to 966° C. over a period of 1 hour.

A $KTiOPO_4$ (KTP) seed crystal 26 roughly $1.0 \times 0.75 \times 0.5$ cm$^3$, ultrasonically drilled, tapped, threaded, and mounted onto the end of a threaded platinum rod 27 affixed to the shaft 25, was immersed in the center of the volume of liquid 1. As shown in FIG. 1 and in detail in FIG. 2 the end of the rod 27 attached to the seed crystal 26 has a 90° bend so that the central a axis of the seed crystal is oriented at approximately 90° C. to the vertical. The temperature of the furnace was set to continually decrease at a rate of 5° C. per day. After 2 hours, clean surfaces having formed on the seed crystal 21 by slight meltback of its surfaces, the $KTiOPO_4$ seed crystal 26 was started rotating in the liquid at 10 RPM. The rotation direction was reversed every 10 seconds with a 4 second pause before each direction change. The rotation of the seed crystal 26 and its change of rotation direction was achieved by a controlled reversing motor 28 coupled to the end of shaft 25 opposite to the rod 27. After 18 more hours, this rotation rate was increased to 50 RPM. After 11 days, the rod 27 was withdrawn 8 cm so to be out of the liquid and the furnace temperature was ramped down to 300° C. at a rate of 25° C. per hour. The rod 27 was then completely removed from the furnace. The substantially flawless $KTiOPO_4$ crystal boule on the end of the rod measured roughly $4 \times 3.3 \times 1.7$ cm$^3$. Flawless clear plates oriented in the optimal direction for second harmonic generation were subsequently cut from this crystal that measured as large as $1.0 \times 1.0 \times 0.7$ cm$^3$.

While in this preferred example the seed crystal was oriented at 90° to the vertical, it is apparent that minor variations in the angle of orientation may be employed. Thus the seed crystal may be oriented at 85° or even 80° to the vertical. The heat pipe, which is available commercially, in one form contains within its partially hollow walls an open channelled wicking structure filled with metallic sodium. Within the operating temperature range, the sodium exists in both the liquid and vapor phases. Highly efficient heat transfer is effected through vaporization of the sodium liquid in locally hot regions and pressure-driven flow of the vapor to relatively cool regions where condensation occurs. Continuous passive operation is effected by an opposed surface tension driven flow of liquid through the wicking structure. The resultant effective thermal conductivity is several orders of magnitude higher than the best metallic conductors. While sodium was employed in the heat pipe in the preferred example, other materials which would function in the same manner can be substituted.

It is understood that various modifications to the above-described invention will become evident to those skilled in the art and that the invention described herein is for illustrative purposes and is not to be considered restrictive.

What is claimed is:

1. In a method of producing substantially flaw-free single crystals of a composition of the formula $MTiOXO_4$ wherein M is an element selected from the group consisting of K, Rb and Tl and X is an element selected from the group consisting of P and As, the steps comprising:
   (a) preparing a mixture of $MTiOXO_4$ and a flux comprising the oxides of M and X in the ratio by weight of M to X in the range of 3:1 to 1:1 or of their precursors and producing a melt thereof by heating said mixture, the ratio by weight of $MTiOXO_4$ to flux at the seeding temperature being substantially equal to the saturation value of said $MTiOXO_4$ in said flux;
   (b) suspending a seed crystal of said $MTiOXO_4$ in said melt;
   (c) slowly decreasing the temperature of said melt while maintaining essentially spatially isothermal conditions throughout said melt, the maximum temperature difference being not greater than about 4° C., to thereby cause said $MTiOXO_4$ to crystallize from said melt on said seed crystal; and
   (d) continuing decreasing the temperature of said melt until crystallization of said $MTiOXO_4$ on said seed crystal is completed.

2. In a method of producing substantially flaw-free single crystals of a composition of the formula $MTiOXO_4$ wherein M is an element selected from the group consisting of K, Rb and Tl and X is an element selected from the group consisting of P and As, the steps comprising:
   (a) preparing a mixture of $MTiOXO_4$ and a flux comprising the oxides of M and X in the ratio by weight of M to X in the range of 3:1 to 1:1 or of their precursors and producing a melt thereof by heating said mixture to a temperature of 750° C.–1100° C., the ratio by weight of $MTiOXO_4$ to flux at the seeding temperature being substantially equal to the saturation value of said $MTiOXO_4$ in said flux;
(b) suspending a seed crystal to said $MTiOXO_4$ in said melt;
(c) decreasing the temperature of said melt at a rate not greater than 5° C. per hour while maintaining essentially spatially isothermal conditions throughout said melt, the maximum temperature difference being not greater than about 4° C., to thereby cause said $MTiOXO_4$ to crystallize from said melt on said seed crystal; and
(d) continuing decreasing the temperature of said melt until crystallization of said $MTiOXO_4$ on said seed crystal is completed.

3. In method of producing substantially flaw-free single crystals of a composition of the formula $MTiOXO_4$ wherein M is an element selected from the group consisting of K, Rb and Tl and X is an element selected from the group consisting of P and As, the steps comprising:
(a) preparing a mixture of $MTiOXO_4$ and a flux comprising the oxides of M and X in the ratio by weight of M to X in the range of 3:1 to 1:1 or of their precursors and producing a melt thereof by heating said mixture to a temperature of 750° C.–1100° C., the ratio by weight of $MTiOXO_4$ to flux at the seeding temperature being substantially equal to the saturation value of said $MTiOXO_4$ in said flux;
(b) suspending a seed crystal of said $MTiOXO_4$ in said melt;
(c) decreasing the temperature of said melt at a rate of about 0.1° C.–20° C. per day, while rotating said seed crystal and maintaining essentially spatially isothermal conditions throughout said melt, the maximum temperature difference being not greater than about 4° C., to thereby cause said $MTiOXO_4$ to crystallize from said melt on said seed crystal; and
(d) continuing decreasing the temperature of said melt until crystallization of said $MTiOXO_4$ on said seed crystal is completed.

4. The method of claim 3 wherein the seed crystal is rotated at the rate of 5–100 RPM.

5. The method of claim 4 wherein the direction of rotation of the seed crystal is reversed once per each 5 seconds to 5 minutes.

6. The method of claim 2 wherein M is K and X is P.

7. The method of claim 5 wherein M is K and X is P.

8. The method of claim 6 wherein the ratio by weight of K to P in the flux is about 1.5:1 to 1:1.

9. The method of claim 7 wherein the ratio by weight of K to P in the flux is about 1.5:1 to 1:1.

10. The method of claim 8 wherein the temperature of the melt is decreased at a rate of 0.1° C.–20° C. per day.

11. The method of claim 10 wherein the melt is formed by heating a mixture of $K_2HPO_4$, $KH_2PO_4$ and $TiO_2$.

12. In a method of producing substantially flaw-free single crystals of a composition of the formula $MTiOXO_4$ wherein M is an element selected from the group consisting of K, Rb and Tl and X is an element selected from the group consisting of P and As, the steps comprising:
(a) preparing a mixture of $MTiOXO_4$ and a flux comprising the oxides of M and X in the ratio by weight of M to X in the range of 3:1 to 1:1 or of their precursors and producing a melt thereof by heating said mixture to a temperature of 750° C.–1100° C., the ratio by weight of $MTiOXO_4$ to flux at the seeding temperature being substantially equal to the saturation value of said $MTiOXO_4$ in said flux;
(b) suspending a seed crystal to said $MTiOXO_4$ in said melt;
(c) decreasing the temperature of said melt at a rate of about 0.1° C.–20° C. per day, while rotating said seed crystal and maintaining essentially spatially isothermal conditions throughout said melt, the maximum temperature difference being not greater than about 4° C. by enclosing said melt in a heat pipe, to thereby cause said $MTiOXO_4$ to crystallize from said melt on said seed crystal; and
(d) continuing decreasing the temperature of said melt until crystallization of said $MTiOXO_4$ on said seed crystal is completed.

13. The method of claim 12 wherein M is K and X is P.

14. The method of claim 13 wherein the directive motion of the seed crystal is reversed every 5 seconds to 5 minutes with about a 4 second pause between reversals.

15. The method of claim 14 wherein the ratio of K to P by weight in the flux is about 1.5:1 to 1:1.

16. The method of claim 15 wherein the temperature of the melt is decreased at a rate of 0.5° C.–10° C. per day.

17. In a method of growing a single crystal boule of $KTiOPO_4$ (KTP) from which, substantially flawless single crystals can be cut, the steps comprising:
(a) preparing a mixture of KTP and a flux comprising the oxides of K and P in the ratio by weight of K:P in the range of 3:1 to 1:1 or of their precursors,
(b) heating said mixture in a crucible mounted within a heat pipe extending vertically within the furnace so as to completely enclose the crucible and to extend above and below the crucible a distance at least equal to the crucible height, said heating being such as to raise the temperature of the mixture to a first temperature value of about 1000° C. to form a melt of said mixture,
(c) reducing the temperature of the melt to a second temperature value of about 970° C. and maintaining the melt at said second temperature value under essentially spatially gradient-free isothermal conditions throughout said melt whereby the maximum temperature difference between any two points of the melt is not greater than about 4° C.,
(d) mounting a seed crystal of KTP on the end of a seed holder in such manner that the central a axis of the seed crystal is oriented at about 90° with respect to the vertical,
(e) moving the seed holder relative to the crucible so as to immerse the seed crystal approximately midway between the bottom and surface and maintaining the seed crystal in that position under conditions such that at least surface portions of the seed surfaces have melted back to provide clean surfaces for subsequent crystal growth,
(f) rotating the seed holder about a vertical axis so as to rotate the seed crystal within the melt,
(g) slowly decreasing the temperature of said melt with regular reversals of rotation direction, while continuing to rotate the seed crystal and while continuing to maintain the isothermal conditions to cause KTP to crystallize from said melt onto said seed crystal to form the boule until the temperature reaches a third temperature value of about 900° C., (h) moving the seed holder relative to the crucible so as to remove the newly grown boule from the melt but retain the newly grown boule in the furnace, (i) decreasing the temperature of the furnace to a fourth temperature value below 900° C. and maintaining said furnace at said fourth temperature value until the newly grown boule has thermally stabilized, (j) removing the newly grown boule from the furnace and cutting from it substantially flawless single crystals having dimensions of the order of centimeters.

18. In a method of growing a single crystal boule of KTiOPO$_4$ (KTP) from which, substantially flawless single crystals can be cut, the steps comprising:

(a) preparing a mixture of KTP and a flux comprising the oxides of K and P in the ratio by weight of K:P in the range of 3:1 to 1:1 or of their precursors, (b) heating said mixture in a crucible mounted within a heat pipe extending vertically within the furnace so as to completely enclose the crucible and to extend above and below the crucible a distance at least equal to the crucible height, said heating being such as to raise the temperature of the mixture to a first temperature value of about 1000° C. to form a melt of said mixture, (c) reducing the temperature of the melt to a second temperature value of about 970° C. and maintaining the melt at said second temperature value under essentially spatially gradient-free isothermal conditions throughout said melt whereby the maximum temperature difference between any two points of the melt is not greater than about 4° C., (d) mounting a seed crystal of KTP on the end of a seed holder in such manner that the central a axis of the seed crystal is oriented at about 90° with respect to the vertical, (e) moving the seed holder relative to the crucible so as to immerse the seed crystal approximately midway between the bottom and surface and maintaining the seed crystal in that position under conditions such that at least surface portions of the seed surfaces have melted back to provide clean surfaces for subsequent crystal growth, (f) rotating the seed holder about a vertical axis so as to rotate the seed crystal within the melt, (g) slowly decreasing the temperature of said melt at the rate of 0.5° C./day–10° C./day with periodic reversals of rotation direction, while continuing to rotate the seed crystal and while continuing to maintain the isothermal conditions to cause KTP to crystallize from said melt onto said seed crystal to form the boule until the temperature reaches a third temperature value of about 900° C., (h) moving the seed holder relative to the crucible so as to remove the newly grown boule from the melt but retain the newly grown boule in the furnace, (i) decreasing the temperature of the furnace to a fourth temperature value below 900° C. and maintaining said furnace at said fourth temperature value until the newly grown boule has thermally stabilized, (j) removing the newly grown boule form the furnace and cutting from it substantially flawless single crystals having dimensions of the order of centimeters.

19. In a method of growing a single crystal boule of KTiOPO$_4$ (KTP) on a seed crystal of KTP suspended in a melt of said mixture, from which, substantially flawless single crystals can be cut, the steps comprising:

(a) preparing a mixture of KTP and a flux comprising the oxides of K and P in the ratio by weight of K:P in the range of 3:1 to 1:1 or of their precursors, the ratio by weight of KTP to the flux at the melting point of said mixture being substantially equal to the saturation value of KTP in said flux, (b) heating said mixture in a crucible mounted within a heat pipe extending vertically within the furnace so as to completely enclose the crucible and to extend above and below the crucible a distance at least equal to the crucible height, said heating being such as to raise the temperature of the mixture to a first temperature value of about 1000° C. to form a melt of said mixture, (c) reducing the temperature of the melt to a second temperature value of about 970° C. and maintaining the melt at said second temperature value under essentially spatially gradient-free isothermal conditions throughout said melt whereby the maximum temperature difference between any two points of the melt is not greater than about 4° C., (d) mounting a seed crystal of KTP on the end of a seed holder in such manner that the central a axis of the seed crystal is oriented at about 90° with respect to the vertical, (e) moving the seed holder relative to the crucible so as to immerse the seed crystal approximately midway between the bottom and surface and maintaining the seed crystal in that position under conditions such that at least surface portions of the seed surfaces have melted back to provide clean surfaces for subsequent crystal growth, (f) rotating the seed holder about a vertical axis so as to rotate the seed crystal within the melt, (g) slowly decreasing the temperature of said melt at the rate of 0.5° C./day–10° C./day with periodic reversals of rotation direction, while continuing to rotate the seed crystal and while continuing to maintain the isothermal conditions to cause KTP to crystallize from said melt onto said seed crystal to form the boule until the temperature reaches a third temperature value of about 900° C., (h) moving the seed holder relative to the crucible so as to remove the newly grown boule from the melt but retain the newly grown boule in the furnace, (i) decreasing the temperature of the furnace to a fourth temperature value below 900° C. and maintaining said furnace at said fourth temperature value until the newly grown boule has thermally stabilized, (j) removing the newly grown boule form the furnace and cutting from it substantially flawless single crystals having dimensions of the order of centimeters.

20. The method of claim 18 wherein the essentially spatially gradient-free isothermal conditions mounted throughout the melt are such that the maximum temperature difference between any two points in the melt is not greater than about 2° C.

21. The method of claim 20 wherein the seed crystal is rotated at a rate of about 50 RPM with a reversal about every 10 seconds including a pause about every 4 seconds between reversals.

22. The method of claim 21 wherein the fourth temperature value is below about 300° C.

23. The method of claim 17 wherein the fourth temperature value of the furnace is between about 300° C.-350° C.

24. The method of claim 18 wherein the fourth temperature value of the furnace is between about 300° C.-350° C.

25. The method of claim 19 wherein the fourth temperature value of the furnace is between about 300° C.-350° C.

* * * * *